United States Patent [19]
Tietz et al.

[11] Patent Number: 5,879,128
[45] Date of Patent: Mar. 9, 1999

[54] LIFT PIN AND SUPPORT PIN APPARATUS FOR A PROCESSING CHAMBER

[75] Inventors: James V. Tietz, Fremont; Benjamin Bierman, Milpitas, both of Calif.

[73] Assignee: Applied Materials, Inc., Santa Clara, Calif.

[21] Appl. No.: 687,165

[22] Filed: Jul. 24, 1996

[51] Int. Cl.⁶ .................................................. B05C 13/00
[52] U.S. Cl. .......................... 414/757; 414/935; 414/939
[58] Field of Search .................... 414/754, 935, 414/939, 757; 187/414, 250

[56] References Cited

U.S. PATENT DOCUMENTS

| | | | |
|---|---|---|---|
| 4,790,258 | 12/1988 | Drage et al. | 414/935 |
| 4,869,801 | 9/1989 | Helms et al. | 414/939 |
| 4,900,962 | 2/1990 | Hockney et al. | 310/90.5 |
| 4,961,352 | 10/1990 | Downer et al. | 74/5.46 |
| 5,155,336 | 10/1992 | Gronet et al. | 219/411 |
| 5,291,975 | 3/1994 | Johnson et al. | 188/378 |
| 5,319,273 | 6/1994 | Hockney et al. | 310/90.5 |
| 5,353,656 | 10/1994 | Hawkey et al. | 74/5.41 |
| 5,396,140 | 3/1995 | Goldie et al. | 310/268 |
| 5,430,271 | 7/1995 | Origami et al. | 414/935 |
| 5,442,288 | 8/1995 | Fenn et al. | |
| 5,636,963 | 6/1997 | Haraguchi et al. | 414/935 |
| 5,730,801 | 3/1998 | Tepman et al. | 414/939 |

*Primary Examiner*—David A. Bucci
*Assistant Examiner*—Gregory A. Morse
*Attorney, Agent, or Firm*—Fish & Richardson

[57] ABSTRACT

A substrate support mechanism including a housing made of a magnetically permeable material; a pin located substantially within the housing and having an upper end extending up into a passage which extends up through the bottom of the chamber and into the cavity which contains a substrate during processing; a first magnet assembly on the inside of the housing and mounted on the pin; a carriage structure located outside of the housing; and a second magnet assembly mounted on the carriage structure, wherein the first and second magnet assemblies are positioned relative to each other so that the second magnet assembly causes the pin and the first magnet assembly to magnetically levitate within the housing.

39 Claims, 8 Drawing Sheets

LIFT PIN AND SUPPORT PIN APPARATUS FOR A PROCESSING CHAMBER

BACKGROUND OF THE INVENTION

The invention relates to substrate support mechanisms such as are used in a semiconductor processing chamber, e.g. a rapid thermal processing (RTP) chamber.

In an integrated circuit fabrication process, a substrate processing device holds a substrate in a processing chamber and subjects the substrate to a chemical or physical process, such as etching, deposition, or annealing, just to name three examples. Inside the processing chamber, the substrate rests on a susceptor, support ring, platen, or some other substrate support. In order to increase throughput, prevent contamination, and avoid human error, an automated robot handler moves the substrate into and out of the chamber. A gentle "hand-off" between the robot handler and the substrate support is typically accomplished by a lift pin apparatus.

The lift pin apparatus includes several lift pins which can move vertically to raise and lower the substrate. To transfer a substrate from the robot handler to the support, the lift pins rise vertically and pick the substrate off the robot handler. After the robot handler retracts, the lift pins lower the substrate onto the support. When the process is complete, the lift pins raise the wafer off the support and the robot handler is positioned beneath the substrate. Then the lift pins lower the substrate onto the robot handler.

SUMMARY OF THE INVENTION

In general, in one aspect, the invention is a substrate support mechanism for use with a processing chamber which encloses an internal cavity and has a chamber bottom. The apparatus includes a housing made of a magnetically permeable material; a pin located substantially within the housing and having an upper end extending up into a passage which extends up through the bottom of the chamber and into the cavity which contains a substrate during processing; a first magnet assembly on the inside of the housing and mounted on the pin; a carriage structure located outside of the housing; and a second magnet assembly mounted on the carriage structure. The first and second magnet assemblies are positioned relative to each other so that the second magnet assembly causes the pin and the first magnet assembly to magnetically levitate within the housing.

Preferred embodiments have the following features. The apparatus also includes a lifting mechanism which raises and lowers the carriage structure and thereby raises and lowers the pin. The lifting mechanism has a raised position and a lowered position. When the lifting mechanism is in its raised position, the pin extends up through the passage and into the internal cavity so that a top of the pin is located above a plane in which the substrate is held during processing. When the lifting mechanism is in its lowered position, the pin is retracted into the hole so that its top lies at a level that is located below the plane in which the substrate is held during processing. The processing chamber also includes a substrate support ring for supporting the substrate at its perimeter and spaced above the bottom of the chamber and the top of the pin is located relative to the substrate support ring so that the pin contacts the backside of the substrate when the substrate is held within the support ring. In one embodiment, the support ring rotates about a rotational axis during use and the pin is aligned along the rotational axis and the top of the pin contacts and is biased against the center of the backside of the substrate. The top of the pin is shaped so as to minimize the area of contact between the top of the pin and the backside of the substrate, e.g. it is rounded. In addition, the first and second magnet assemblies are constructed so as to permit the pin to freely rotate during use.

In general, in another aspect, the invention is an apparatus for processing a substrate. The apparatus includes a vacuum chamber enclosing an internal cavity and having a chamber bottom; a support mechanism inside the chamber which supports the substrate during processing; a housing made of a magnetically permeable material and mounted beneath the chamber; a pin located within the housing and having an upper end extending up into a passage that extends up through the bottom of the chamber and into the cavity which contains the substrate during processing; a first magnet assembly on the inside of the housing and mounted on the pin; a carriage structure located outside of the housing; and a second magnet assembly mounted on the carriage structure, wherein the first and second magnet assemblies are positioned relative to each other so that the second magnet assembly causes the pin and the first magnet assembly to magnetically levitate within the housing.

DESCRIPTION OF THE PREFERRED EMBODIMENTS

Figure 1:
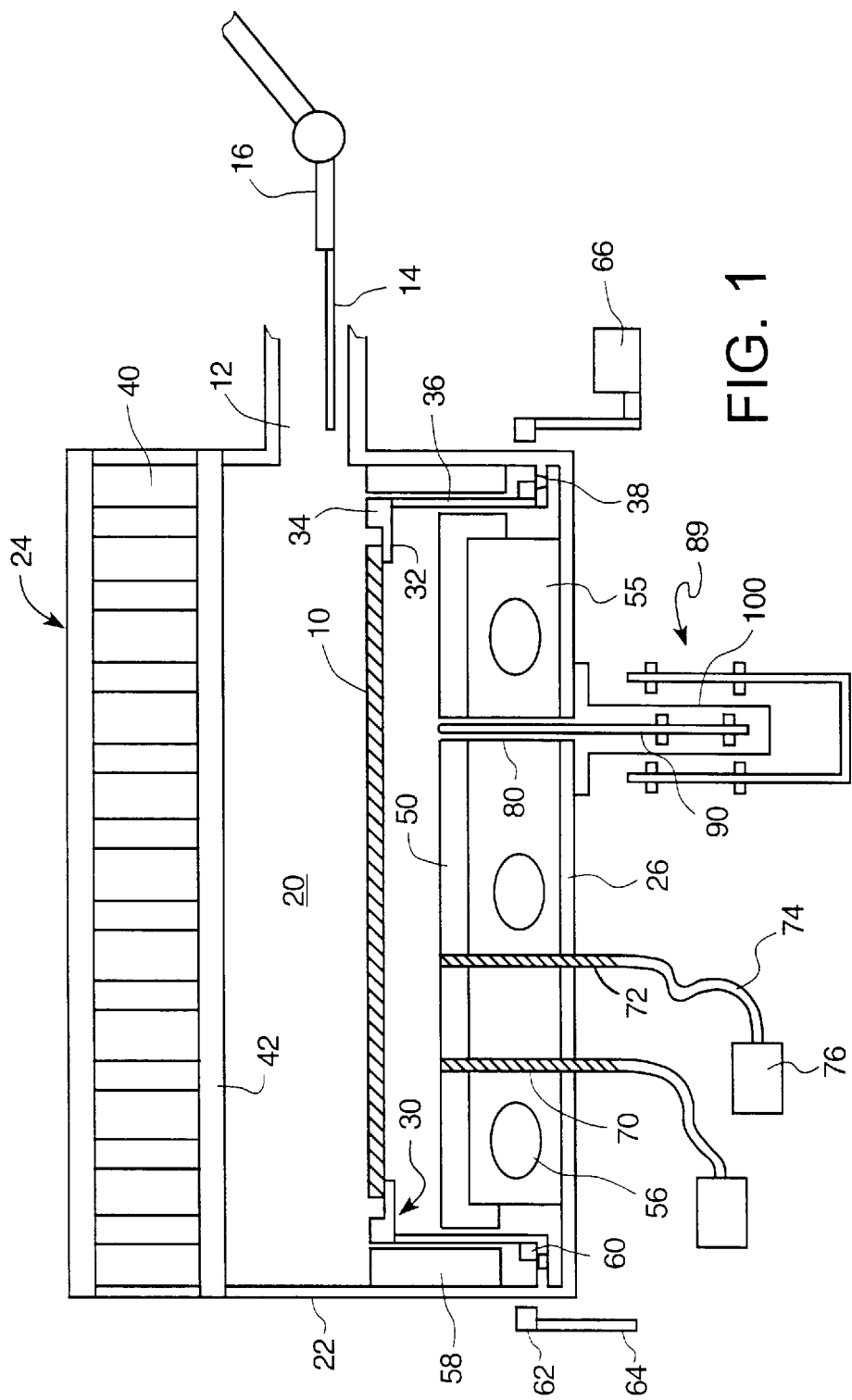
FIG. 1 is a schematic cross-sectional view of a substrate processing chamber.

As shown in FIG. 1, in an rapid thermal processing (RTP) processing system, a rotating substrate support structure 30 holds a disk-shaped silicon substrate 10 (e.g. 150–300 mm) in diameter) inside a processing chamber 20. Chamber 20, which includes a top 24, a cylindrically-shaped side wall 22, and a bottom wall 26, defines a sealed cavity. Radiant energy from a water-cooled heating element 40, such as an array of tungsten-halogen lamps, located at the top of the chamber passes through a quartz window 42 into the cavity within chamber 20 and quickly and uniformly heats substrate 10 to an elevated temperature at which processing is carried out. The processing that can be performed in such a chamber, includes for example, annealing, cleaning, chemical vapor deposition, doping, etching, oxidation, and nitration. Depending upon the type of processing that is to be performed, reactive and/or inert gasses are flowed into the chamber during processing.

At the bottom of the chamber and beneath substrate 10, a stainless steel base 55 supports a reflector plate 50, which is, for example, made of aluminum coated with a thin, highly reflective layer, such as gold. Coolant liquid circulates through passages 56 in base 55 to cool the base during processing.

Substrate support 30 includes an edge ring 32 having a lip 34. Lip 34 centers substrate 10 and prevents it 10 from slipping laterally off edge ring 32 when the substrate support structure is rotating. Edge ring 32, which supports substrate 10 above reflector plate 50, e.g. within about 1 cm., rests on and is supported by a cylindrical support tube 36 which in turn sits on a bearing assembly 38 that allows support tube 36 to rotate. Bearing assembly 38 is protected from deposition materials and heat by a shield 58 that surrounds support tube 36. An azimuthal drive mechanism, which rotates support tube 36, includes a motor 66 which spins a drive ring 64 located outside walls 22 of chamber 20. Magnets 62 mounted on drive ring 64 are magnetically coupled through side wall 22 to a set of magnets 60 mounted on support tube 36. When the motor spins drive ring 64, the magnetic coupling between magnets 60 and magnets 62 causes support tube 36 and thus substrate 10 to rotate. Typically, the drive mechanism rotates the support tube at about ninety revolutions per minute; however, higher speeds may also be used if appropriate.

The system also includes a sensor system to measure the temperature of the substrate during processing. The sensor system includes multiple pyrometers 76, which use an associate optical fiber 74 connected to a light pipe 72 to sample radiation in the cavity formed between the bottom of substrate 10 and the top of reflector plate 50. Light pipe 72 are retained in conduits 70 which extend up through base 55 to the top of reflector plate 50. The pyrometers 76 convert the sampled radiation to a temperature reading.

Beneath chamber 20 there is a lift mechanism 89 which is used to receive substrate 10 within chamber 20 and lower it onto edge ring 32 prior to processing and later to raise substrate 10 off of edge ring 32 so that it can be removed from chamber 20 after processing. Lift mechanism 89 includes a set of lift pins 90 (only one of which is shown in FIG. 1) which pass through lift pin holes 80 extending up through the bottom wall of chamber 20, base plate 55 and reflector plate 50. Each lift pin 90 is contained within a corresponding enclosed lift pin housing 100 (of which there are three in the described embodiment) that is mounted to the bottom of the chamber.

Figure 2A:
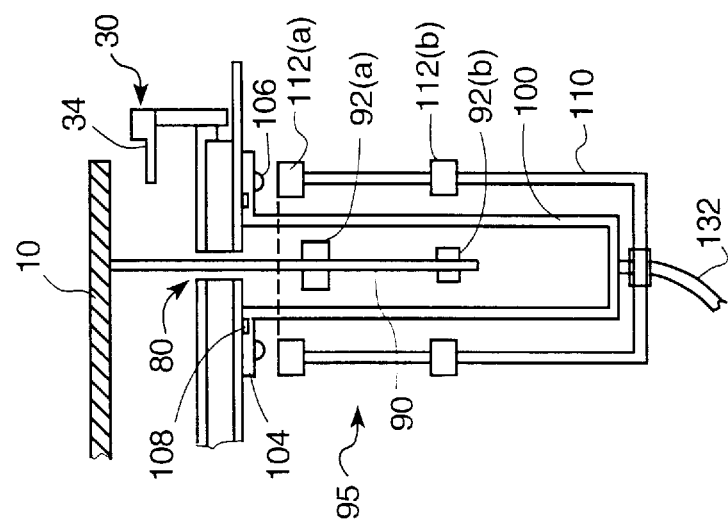
FIGS. 2A–2C are schematic cross-sectional views of a lift pin apparatus.
Figure 2B:
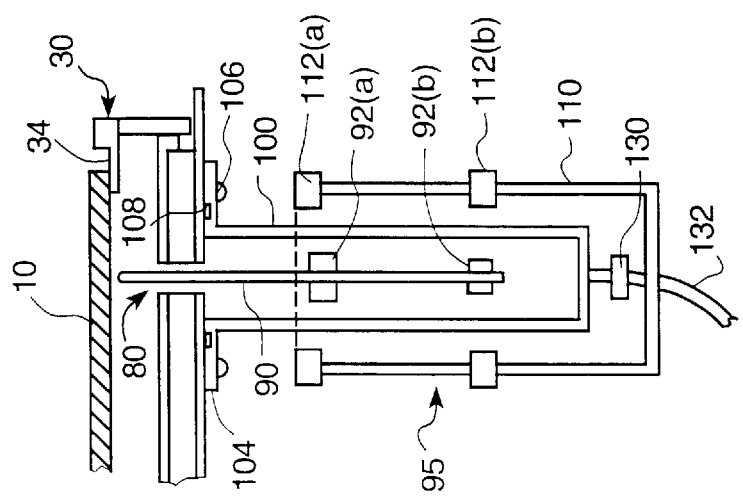
Figure 2C:
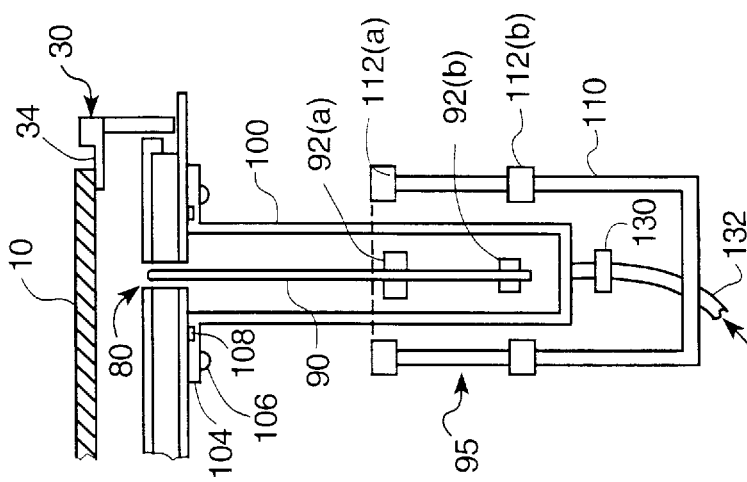

Referring to FIGS. 2A–2C, lift pin 90 is magnetically supported within lift pin housing 100 so that it does not physically contact either the housing or the hole through which it passes up into the chamber. A magnetic linear bearing 95 which is used to levitate each lift pin 90 within enclosed housing 100 includes an upper magnet assembly 92a and a lower magnet assembly 92b mounted on lift pin 90 within housing 100 and it includes a corresponding upper magnet assembly 112a and a lower magnet assembly 112b mounted on a movable carriage 110 positioned outside of and surrounding lift pin housing 100. In the following description, magnet assemblies 92a and 92b will also be generally referred to as magnet assembly 92. Similarly, magnet assemblies 112a and 112b will also be generally referred to as magnet assembly 112.

Each lift pin housing 10 is made of a magnetically permeable material, e.g. stainless steel. Thus, the magnetic fields from magnet assembly 92 and from magnet assembly 112 interact with each other. The magnet assemblies are oriented with respect to each other so that they exert a repelling force on each other. Also, they are positioned so that the repelling force supports lift pin 90 against gravity and holds lift pin 90 laterally in a stable position without contacting the inner surface of the housing or the hole through which it passes into the chamber. To accomplish this, the magnets can be arranged relative to each other in various ways well known to persons skilled in the art. In the described embodiment, lower magnet assembly 92b is positioned in a plane that is slightly above the plane of lower magnet assembly 112b outside of housing 100 and upper magnet assembly 92a is positioned in a plane that is slightly below the plane of upper magnet assembly 112a outside of housing 100. Thus, the lower sets of magnets (i.e., magnet assemblies 92b and 112b) exert an upward force on the pin against gravity and preventing it from falling to the bottom of the housing and the upper sets of magnets (i.e., magnet assemblies 92a and 112a) exert a downward force on the pin to thereby "clamping" the pin against the force generated by the lower magnet assemblies. This arrangement tends to hold the stabilize the pin and produce a more positive control of the movement of the pins especially when they are lowered.

Magnet assemblies 92 and 112 can be of a simple design, or they can be of a complex design such as is described in U.S. Pat. No. 5,319,273, incorporated herein by reference. Also, in this embodiment it is not necessary that the lift pins be able to rotate.

It should be noted that lift pins holes 80 produce an area on the reflecting plate that is non-reflecting. To produce uniform heating of the wafer, it is necessary to have a reflector plate that has both a high reflectivity and a reflectivity that is as uniform as is possible. Thus, it is desirable that lift pin holes 80 and lift pins 90 have as small a diameter as is practical so as to minimize the amount by which they perturb the temperature of the wafer at location directly above the holes. Of course, the pins should not be so small as to be unreasonably fragile. In addition, there must be a sufficiently large gap between the lift pin and the wall of the lift pin hole so that the lift pin does not contact the wall and thereby produce particulate contamination that can destroy the devices that are being processed in the chamber. In the described embodiment, lift pin hole 80 is about 4.75 millimeters (mm) in diameter and lift pin 90 is about 2 mm in diameter, leaving a tolerance of about 2.75 mm.

Lift pins 90 are raised and lowered by raising and lowering carriage 110. As shown by FIGS. 2A–C, when carriage 110 moves up vertically, the magnetically levitated pin is pushed up through lift pin hole 80 so that it contacts and raises the wafer off of edge support ring 34.

Figure 3A:
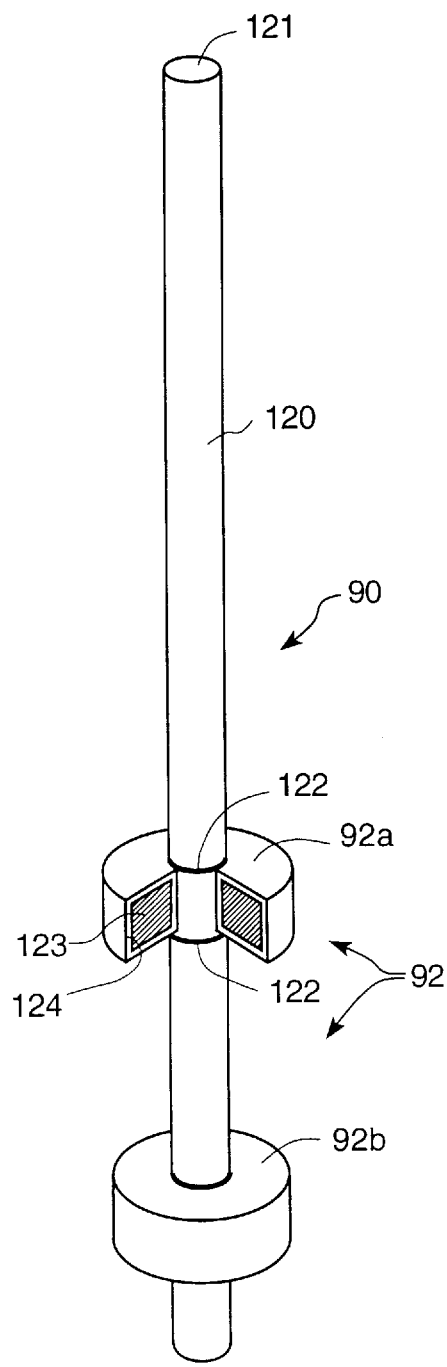
FIGS. 3A and 3B are schematic perspective views, partially cut-away, of embodiments of a lift pin.
Figure 3B:
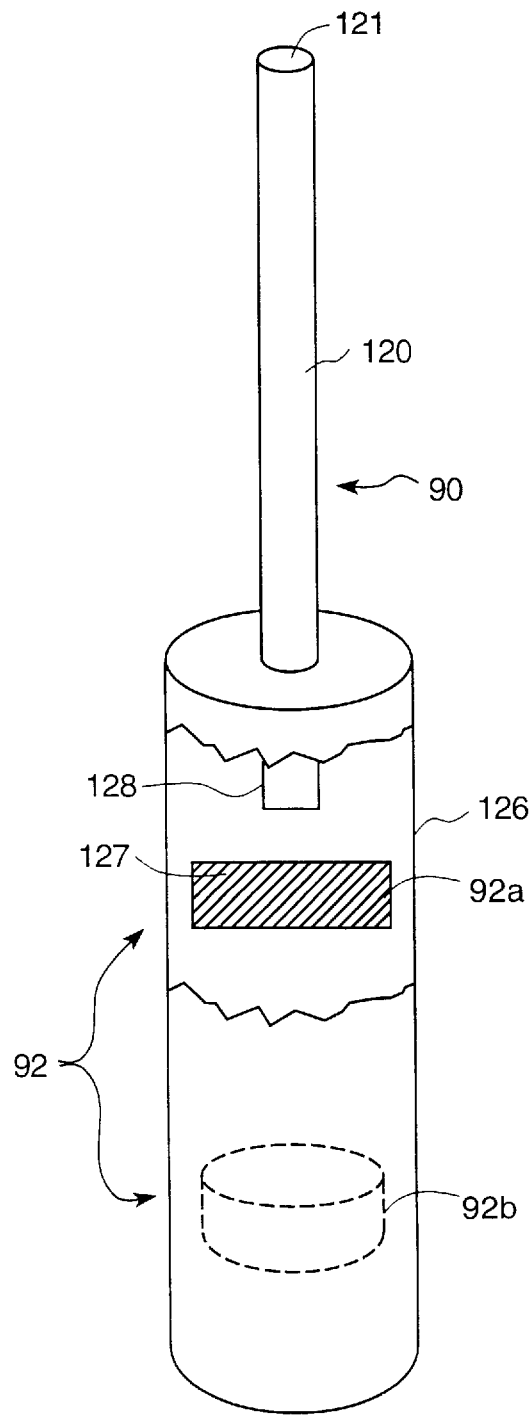

Referring to FIGS. 3A and 3B, lift pin 90 includes a rod 120, which in the described embodiment is made of quartz. Rod 120 has a flat top surface 121 for contacting substrate 10. Magnet assemblies 92 are mounted on the lower portion of rod 120, which remains within lift pin housing 100. In one embodiment, shown in FIG. 3A, two molded magnets 92a and 92b, encircle and snap fit over raised portions 122 on rod 120. Each magnet is an iron-silicon torus 123 coated with a protective layer 124, which is made of nickel or plastic or any material that is resistant to the reactive gasses, e.g., fluorine and chlorine, that are used in chamber 20 during processing.

In another embodiment, shown in FIG. 3B, a lower portion 126 of lift pin 90 is made of an injection molded, high-temperature, corrosion resistant plastic, such as Ryton. Lower portion 126 encapsulates two magnets 92a and 92b, each of which is an iron-silicon disk 127. Lower portion 126 has a cylindrical hole 128 into which the bottom of quartz rod 120 fits tightly.

As shown in FIGS. 2A–C and 4, stainless steel lift pin housing 100 includes a cylindrical tube 102 which is closed at one end and has a outwardly-projecting flange 104 at the other end. Other corrosion resistant, magnetically permeable, non-conductive materials may be used in place of stainless steel. Screws 106 secure lift pin housing 100 to bottom wall 26 and an o' ring 108 between flange 104 and bottom wall 26 forms a seal therebetween so as to form a gas barrier. A supply line 132 connected to the bottom of lift pin housing 100 through a connector 130 supplies purge gas during processing. The purge gas is typically a non-reactive or inert gas (e.g. argon or nitrogen) that is used to create a slight positive pressure within lift pin housing 100 relative to the chamber so that process gases from the chamber do not enter the lift pin housing during processing and to flush out any reactive gases that might enter the housing.

Note that raising and lowering lift pin 90 is accomplished without producing any change in the internal volume of the cavity in which the lift pin is housed. This provides a distinct advantage over other conventional lift pin mechanisms which use a bellows assembly to raise and lower the lift pins. First, no reactive gases are sucked into the pin housings when the pins are lowered. Second, since the bottom floor of the lift pin housing does not move, as it does in the case of the bellows mechanism, it is easier to mechanically couple the purge gas supply to the housing. The connection will not be exposed to repeated flexing which can lead to failure.

Figure 4:
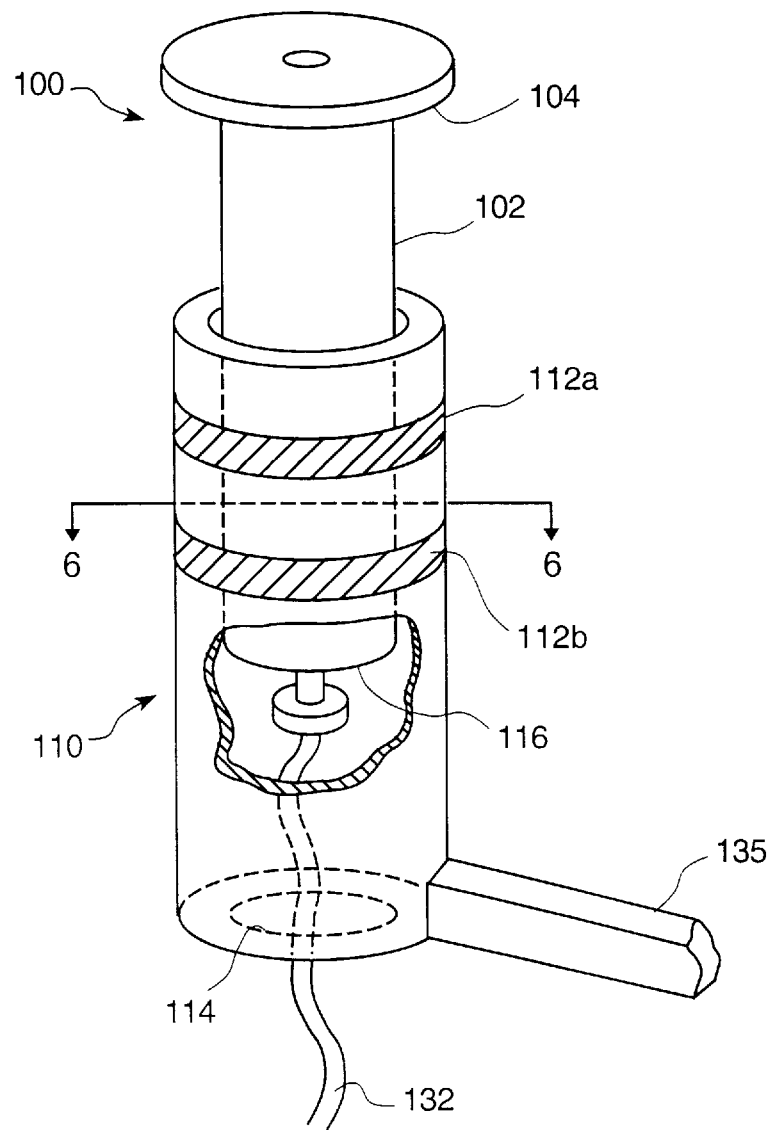
FIG. 4 is a schematic perspective view of a magnet support structure.

As shown in FIG. 4, carriage 110 fits around lift pin housing 100 and magnet assemblies 112*a* and 112*b* mechanically attach to carriage 110 in a plane that is perpendicular to the longitudinal axis of lift pin housing 100. Purge gas line 130 runs up through a hole 114 in the bottom of carriage 110. Carriage 110 is loosely connected to an arm 135, which is raised and lowered by a mechanical drive (not shown in this view).

Figure 5:
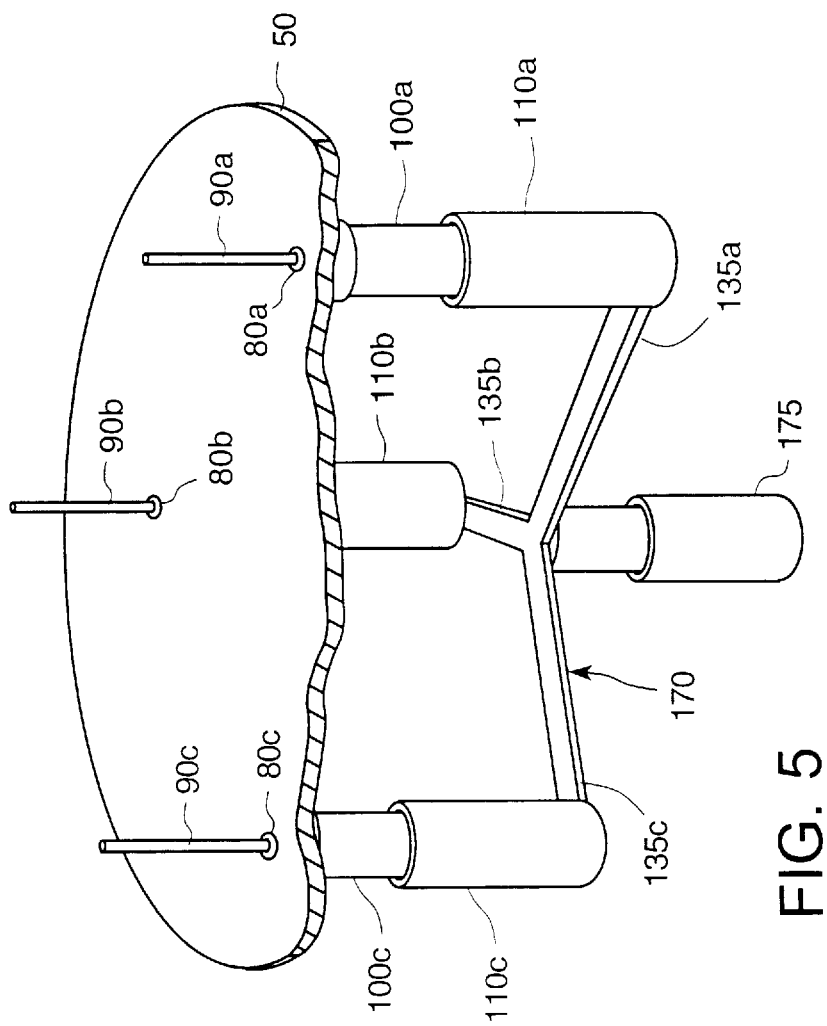
FIG. 5 is a schematic perspective view of lift pins supporting a substrate above a support ring.

In one embodiment shown in FIG. 5, three lift pins 90*a*, 90*b*, and 90*c*, which are positioned at vertices of an equilateral triangle, project up through three lift pin holes 80*a*, 80*b*, and 80*c*, respectively, to contact the underside of the substrate (not shown). A spider assembly 170 and a vertical drive mechanism 175, which is physically mounted onto chamber 20, controls the raising and lowering of lift pins 90*a*–90*c*. Spider assembly 170 has three arms 135*a*–135*c* loosely connected to the three carriages 110*a*–110*c*, respectively. Vertical drive mechanism 175, which might be for example a pneumatic drive, and spider simultaneously move the three lift pins up and down.

Referring also to FIG. 1, in typical operation, a blade 14 on a computer-controlled robot arm 16 carries substrate 10 through a port 12 into chamber 20. Lift pins 90*a*–90*c* rise about one inch and lift substrate 10 from blade 14. After blade 14 retracts, lift pins 90*a*–90*c* retract back into lift pin holes 80*a*–80*c*, thereby lowering substrate 10 onto edge ring 32. Substrate 10 is then subjected to a processing step or steps. Once the processing step or steps are complete, substrate 10 is removed in the same manner as it was placed in chamber 20: lift pins 90*a*–90*c* rise up and lift substrate 10 from edge ring 32; blade 14 moves underneath substrate 10; lift pins 90*a*–90*c* retract and lower substrate 10 onto the blade; and, finally, blade 14 carries the substrate through port 12 and out of chamber 20.

Figure 6:
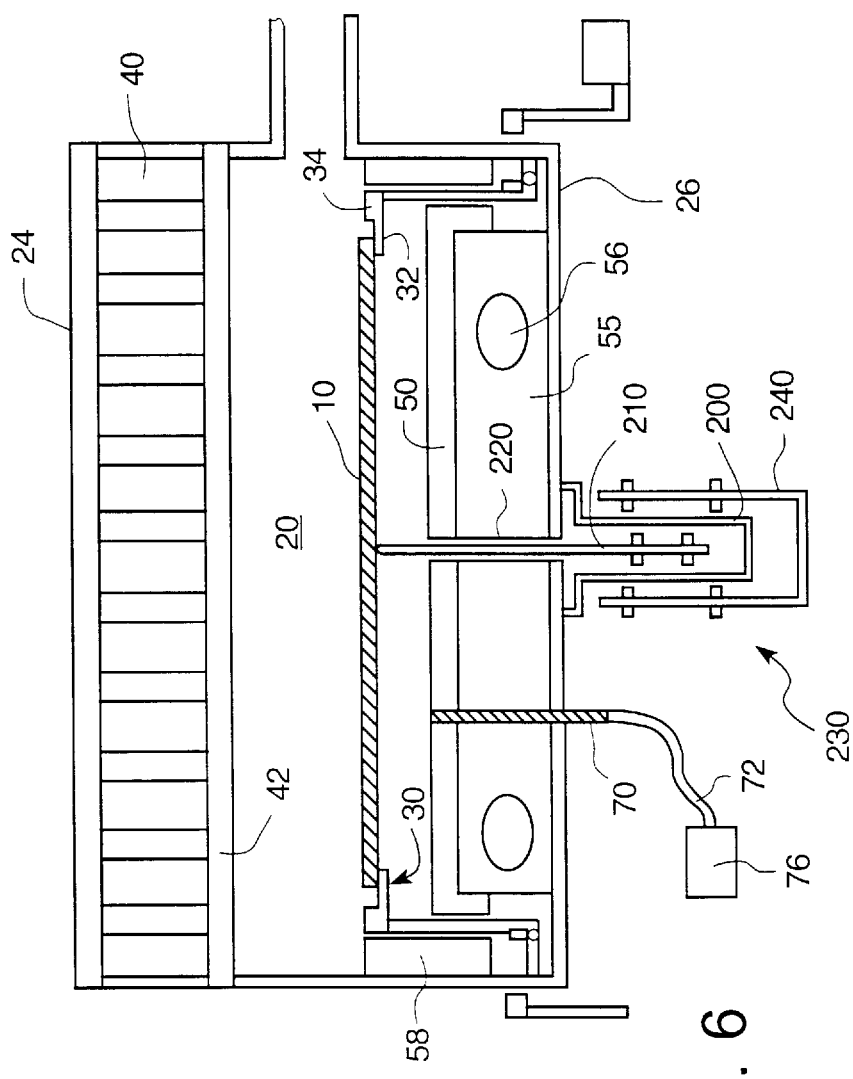
FIG. 6 is schematic cross-sectional view of a support pin housing connected to a processing chamber.

As shown in FIG. 6, the process chamber also includes a mechanism 230 for supporting the center of the substrate during processing. Since substrate 10 is supported at its perimeter by edge ring 32, without this center support mechanism 230, the center of large substrates, e.g., 300 mm diameter or larger, will tend to deflect downward or sag under the force of gravity and particularly at high processing temperatures. Indeed, the resulting stress on the substrate due to the sagging may be sufficient to cause "slip", i.e., shear dislocations of the crystal structure of the substrate which destroys the electrical usefulness of the substrate. Support mechanism 230, which includes a support pin 210 that passes up through a support pin hole 220 to contact the center of the bottom surface of the substrate, prevents the sagging.

Note that we have shown the lift pin mechanism and the support pin mechanism separately from each other. This was for purposes of clear illustration. It should be understood, however, that both mechanisms could be used in the same processing chamber.

A single support pin housing 200, which contains support pin 210, is mounted to the center of the underside of the floor 26 of chamber 20. The design of the support in mechanism is very similar to the design of the lift pin mechanism previously described. However, in this case, it is important that the pin be able to freely rotate while it is supporting the center of the substrate. In addition, support pin 210 has a rounded top end 214, as compared to the flat top end of the lift pin. This is to minimize the contact area between the support pin and the backside of the wafer, which in turn minimizes the thermal load a the point of contact and the risk of producing particulates through rubbing against the backside.

Support pin 210 projects out of support pin housing 200 up through support pin hole 220 and up into chamber 20 where it contacts the backside of the substrate when a substrate is resting in the edge ring. The axes of both support pin hole 220 and support pin 210 are aligned with and are coaxial with the axis of rotation of the support structure 30. Thus, support pin 210 contacts the substrate at its center, which is the point about which rotation takes place.

Figure 7C:
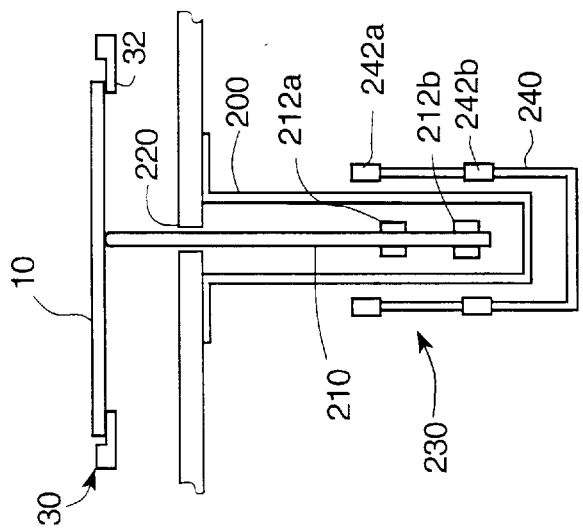
FIGS. 7A–7C are schematic cross-sectional views of a support pin apparatus.
Figure 7B:
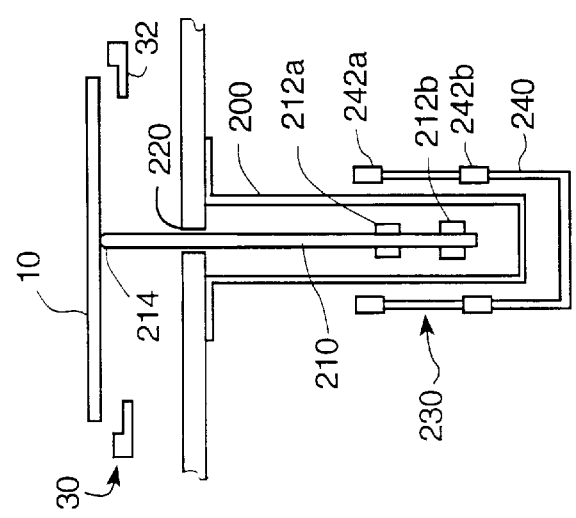
Figure 7A:
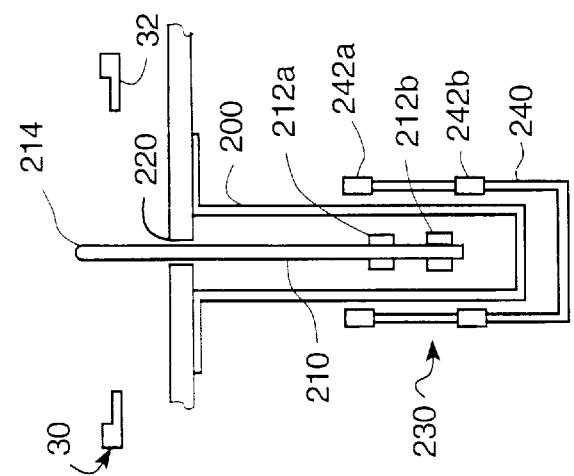

As shown in FIG. 7A, support pin 210 magnetically levitates inside support pin housing 200. A magnetic bearing 230 which supports pin 210 includes an upper and lower magnet assemblies 212*a* and 212*b* (generally referred to as magnet assemblies 212) are mounted on pin 210 and upper and lower magnet assemblies 242*a* and 242*b* (generally referred to as magnet assemblies 242) are mounted on a frame 240 located outside of and surrounding housing 200.

Support pin housing 200 is made of a magnetically permeable material, e.g. stainless steel. The magnet assemblies 212 and 242 are oriented with respect to each other so that the magnetic forces exerted on the pin support pin 210 against gravity and hold it laterally in a stable position so that it does not contact the inner surface of the housing or the hole through which it passes into the chamber. To accomplish this, the magnets can be arranged relative to each other in various ways well known to persons skilled in the art. In the described embodiment, lower magnet assembly 212*b* is positioned in a plane that is slightly above the plane of lower magnet assembly 242*b* and upper magnet assembly 212*a* is positioned in a plane that is slightly below the plane of upper magnet assembly 242*a*. As described previously, this arrangement magnetically clamps the pin between the upper and lower magnet assemblies 242*a* and 242*b* on frame 240.

Magnet assemblies 212 and 242 can be of a simple design or they can be of a more complex design such as is described in U.S. Pat. No. 5,319,273, incorporated herein by reference. Unlike the lift pins, however, it is important that the support pin be able to easily rotate with the substrate as it rotates to thereby reduce any rubbing action between the top of the support pin and the backside of the substrate.

Referring to FIGS. 7B–7C, frame 240 is mounted on chamber 20 in a fixed position and such that the top of support pin lies above the plane in which the backside of the substrate will come to rest when it is lowered onto edge ring 34. When substrate 10 is lowered onto edge support ring 34, its backside contacts support pin 210 and "compresses" the magnetic spring slightly so that the pin is biased against and supports the backside of the substrate. With support pin 210 in contact with the substrate 10, when substrate is rotated the friction between the pin and the substrate will tend to cause the support pin to also rotate.

Alternatively, the support pin 210 can be raised into position in the manner previously described for the lift pins. That is, the support pin can be raised either before the wafer is placed on the edge ring or after it is placed on the support ring. Indeed, the support pin can be part of the wafer lift mechanism.

Figure 8:
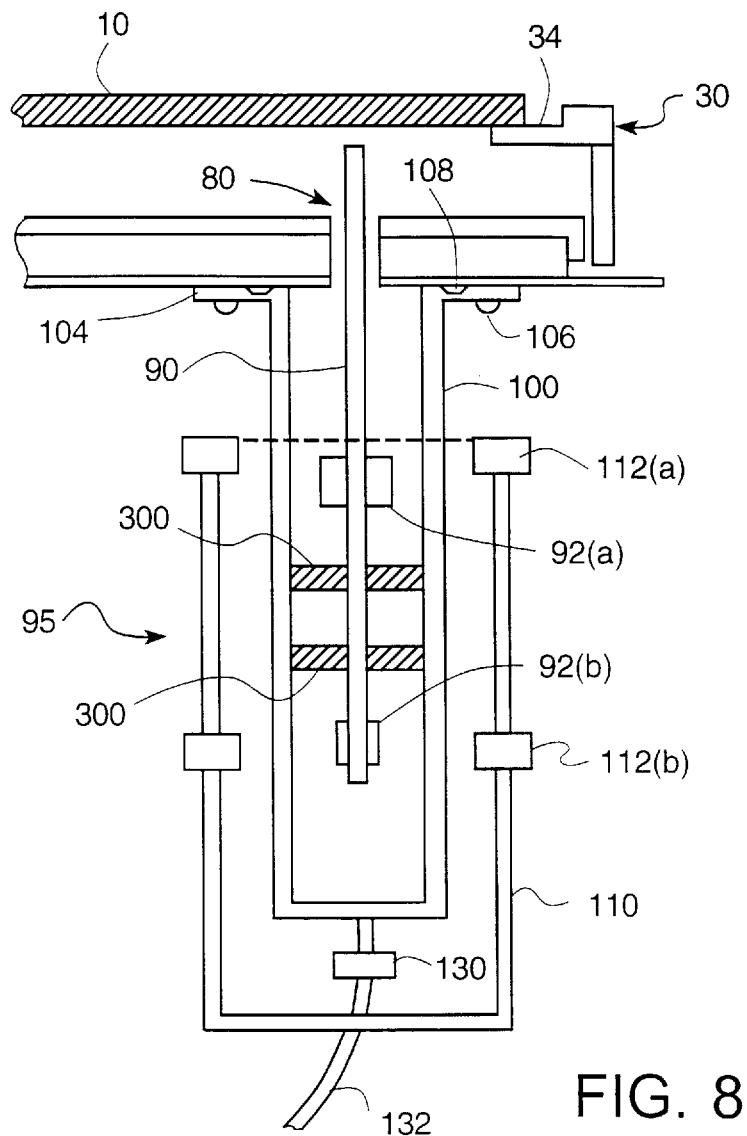
FIG. 8 is a schematic cross-sectional view of an alternative lift pin mechanism.

We have described the pins as being fully magnetically levitated. That is, the pins are held in position both vertically (i.e., the z coordinate) and horizontally (i.e., the x and y coordinates) by magnetic forces. Alternatively, the centering function (i.e., holding the pins at a particular x and y position) can be performed by two bearings 300, as shown in FIG. 8. In this particular embodiment, the bearings 300 are made of a self-lubricating, non-particle generating materials such as polyimid or polyamid plastic materials (e.g. Torlon™ or Vespel™). Thus, in this embodiment, the magnetic force is used primarily to hold the pin in a particular z location and to move it up and down. The bearings can be located at any convenient positions along the length of the pin and in such a manner as to permit the vertical motion that is required of the pins. The bearings 300 can be implemented in any of a number of different ways. For example, they can be fixed within the housing and have a center hole that is sufficiently large to allow the pin to freely move up and down or they can be attached to the pin and move up and down with the pin inside of the housing.

Though we have described the lift pin mechanism in the context of an RTP chamber which uses a edge support ring, it could also be used in any substrate processing chamber in which lift pins are used or may be used to raise a substrate off of and lower the substrate onto a support structure, e.g. a solid pedestal.

Other embodiments are within the following claims.

What is claimed is:

1. A substrate support mechanism for use with a processing chamber which encloses an internal cavity and has a chamber bottom, said apparatus comprising:
    a housing made of a magnetically permeable material;
    a pin located substantially within the housing and having an upper end extending up into a passage which extends up through the bottom of the chamber and into the cavity which contains a substrate during processing;
    a first magnet assembly on the inside of the housing and mounted on the pin;
    a carriage structure located outside of the housing; and
    a second magnet assembly mounted on the carriage structure and holding the first magnet assembly captive in a magnetic field generated by the second magnet assembly,
    wherein the first and second magnet assemblies are positioned relative to each other so that the second magnet assembly magnetically levitates the pin and the first magnet assembly within the housing and so that they are stably aligned along and collinear with a fixed axis.

2. The apparatus of claim 1 further comprising a lifting mechanism which raises and lowers the carriage structure and thereby raises and lowers the pin.

3. The apparatus of claim 2 wherein the lifting mechanism has a raised position and a lowered position, and wherein when the lifting mechanism is in its raised position, the pin extends up through the passage and into the internal cavity so that a top of the pin is located above a plane in which the substrate is held during processing.

4. The apparatus of claim 3 wherein when the lifting mechanism is in its lowered position, the pin is retracted into the hole so that its top lies at a level that is located below the plane in which the substrate is held during processing.

5. The apparatus of claim 1 wherein the processing chamber includes a substrate support ring for supporting the substrate at its perimeter and spaced above the bottom of the chamber and wherein a top of the pin is located relative to the substrate support ring so that the pin contacts the backside of the substrate when the substrate is held within the support ring.

6. The apparatus of claim 5 wherein the support ring rotates about said fixed axis during substrate processing.

7. The apparatus of claim 6 wherein during substrate processing the top of the pin contacts the center of the backside of the substrate.

8. The apparatus of claim 5 wherein the top of the pin is shaped so as to minimize the area of contact between the top of the pin and the backside of the substrate.

9. The apparatus of claim 5 wherein the top of the pin is rounded.

10. The apparatus of claim 5 wherein the first and second magnet assemblies are constructed so as to permit the pin to freely rotate during use.

11. A substrate support mechanism for use with a processing chamber which encloses an internal cavity and has a chamber bottom, said apparatus comprising:
    a substrate support ring which during processing supports the substrate at its perimeter;
    a housing made of a magnetically permeable material;
    a pin located substantially within the housing and having an upper end extending up into a passage which extends up through the bottom of the chamber and into the cavity which contains a substrate during processing;
    a first magnet assembly on the inside of the housing and mounted on the pin;
    a carriage structure located outside of the housing; and
    a second magnet assembly mounted on the carriage structure,
    wherein the first and second magnet assemblies are positioned relative to each other so that the second magnet assembly causes the pin and the first magnet assembly to magnetically levitate within the housing, wherein the pin is biased up against the backside of the substrate when the substrate is held within the support ring during processing.

12. A substrate support mechanism for use with a processing chamber which defines an internal cavity and which has a chamber bottom, said apparatus comprising:
    a plurality of lift pin mechanisms each of which comprises:
        a lift pin housing made of a magnetically permeable material;
        a lift pin located substantially within the lift pin housing and having an upper end extending up into a passage which extends up through the bottom of the chamber and into the cavity within the chamber;
        a first magnet assembly on the inside of the lift pin housing and mounted on the lift pin;
        a carriage structure located outside of the lift pin housing; and a second magnet assembly mounted on the carriage structure and holding the first magnet assembly captive in a magnetic field generated by the second magnet assembly, wherein the first and second magnet assemblies are positioned relative to each other so that the second magnet assembly magnetically levitates the lift pin and the first magnet assembly within the housing and so that they are stably aligned along and collinear with a fixed axis.

13. The apparatus of claim 12 further comprising a lifting mechanism which raises and lowers the plurality of carriage structures and thereby raises and lowers the plurality of lift pins.

14. The apparatus of claim 13 wherein the lifting mechanism has a raised position and a lowered position, and wherein when the lifting mechanism is in its raised position, the plurality of lift pins extend up through their respective passages and into the cavity so that tops of the lift pins are located above a plane in which the substrate is held during processing.

15. The apparatus of claim 14 wherein when the lifting mechanism is in its lowered position, the lift pins are retracted into their respective passages so that their tops lie at a level below the plane defined by the substrate when the substrate is held during processing.

16. The apparatus of claim 15 wherein when the lifting mechanism is in its lowered position, the lift pins are retracted into their respective passages so that their tops do not extend into the cavity within the chamber.

17. The apparatus of claim 13 wherein the lifting mechanism comprises a drive mechanism which produces linear motion and a spider assembly that couples the linear motion of the drive mechanism to all of the carriage structures.

18. The apparatus of claim 17 wherein the lift pin housings are attached to the chamber beneath the bottom of the chamber.

19. The apparatus of claim 13 wherein the drive mechanism is a pneumatic drive mechanism.

20. An apparatus for processing a substrate, said apparatus comprising:
   a chamber enclosing an internal cavity and having a chamber bottom;
   a support mechanism inside the chamber which supports the substrate during processing;
   a housing made of a magnetically permeable material, said housing mounted beneath the chamber;
   a pin located within the housing and having an upper end extending up into a passage that extends up through the bottom of the chamber and into the cavity which contains the substrate during processing;
   a first magnet assembly on the inside of the housing and mounted on the pin;
   a carriage structure located outside of the housing; and
   a second magnet assembly mounted on the carriage structure,
   wherein the first and second magnet assemblies are positioned relative to each other so that the second magnet assembly causes the pin and the first magnet assembly to magnetically levitate within the housing.

21. The apparatus of claim 20 further comprising a lifting mechanism which raises and lowers the carriage structure and thereby raises and lowers the pin.

22. The apparatus of claim 21 further comprising a substrate support ring which supports the substrate at its perimeter and spaced above the bottom of the chamber.

23. The apparatus of claim 22 wherein the lifting mechanism has a raised position and a lowered position, and wherein when the lifting mechanism is in its raised position, the lift pin extends up through the passage and into the cavity so that top of the lift pin is located above a plane in which the substrate is held during processing.

24. The apparatus of claim 23 wherein when the lifting mechanism is in its lowered position, the lift pin is retracted into the passage so that its top lies at a level that is located below the plane defined by the substrate when the substrate is held during processing.

25. An apparatus for processing a substrate, said apparatus comprising:
   a chamber enclosing an internal cavity and having a chamber bottom;
   a support mechanism inside the chamber which supports the substrate during processing;
   a housing made of a magnetically permeable material, said housing mounted beneath the chamber;
   a pin located within the housing and having an upper end extending up into a passage that extends up through the bottom of the chamber and into the cavity which contains the substrate during processing;
   a first magnet assembly on the inside of the housing and mounted on the pin;
   a carriage structure located outside of the housing; and
   a second magnet assembly mounted on the carriage structure,
   wherein the first and second magnet assemblies are positioned relative to each other so that the second magnet assembly causes the pin and the first magnet assembly to magnetically levitate within the housing, wherein the support mechanism comprises a substrate support ring which supports the substrate at its perimeter and spaced above the bottom of the chamber and wherein a top of the pin is located relative to the substrate support ring so that the pin contacts the backside of the substrate when the substrate is held within the support ring.

26. The apparatus of claim 25 wherein the support ring is rotatable about said fixed axis during substrate processing.

27. The apparatus of claim 26 wherein during substrate processing the top of the pin contacts the center of the backside of the substrate.

28. The apparatus of claim 25 wherein the top of the pin is shaped so as to minimize the area of contact between the top of the pin and the backside of the substrate.

29. The apparatus of claim 25 wherein the top of the pin is rounded.

30. The apparatus of claim 25 wherein the pin is biased up against the backside of the substrate when the substrate is held within the support ring during processing.

31. A substrate processing apparatus comprising:
   a chamber having a bottom;
   a substrate support structure within said chamber which during substrate processing holds the substrate at locations around its perimeter and leaves a center region of the backside exposed;
   a support pin having an upper end, said pin extending up from the bottom of the chamber and positioned so that its upper end contacts the backside of the substrate substantially near the center of the substrate during processing.

32. The substrate processing apparatus of claim 31 further comprising:
   a housing made of a magnetically permeable material, said pin located substantially within the housing extending up through a passage extending up through the bottom of the chamber and into the cavity which contains a substrate during processing;

a first magnet assembly on the inside of the housing and supporting said pin; and a second magnet assembly mounted relative to the first magnet assembly so as to magnetically levitate the first magnet assembly and the pin within the housing, wherein the pin is biased up against the backside of the substrate during processing.

33. The substrate processing apparatus of claim 32 wherein the second magnet assembly is mounted outside of the housing.

34. The substrate processing apparatus of claim 33 further comprising a carriage structure located outside of the lift pin housing, wherein the second magnet assembly is mounted on the carriage structure.

35. The substrate processing apparatus of claim 34 wherein the carriage structure is movable along the direction of the axis of the pin.

36. The substrate processing apparatus of claim 32 wherein the first and second magnet assemblies form a magnetic bearing which allows the pin to freely rotate about its axis.

37. The substrate processing apparatus of claim 32 wherein the first magnet assembly is mounted on the pin.

38. The substrate processing apparatus of claim 32 wherein the substrate support structure is a support ring which has a central opening and which supports the perimeter of the substrate during processing and where said apparatus further comprises a motor which rotates the support ring about a rotational axis which is aligned with the axis of the pin.

39. A method of supporting a substrate during processing comprising:

supporting the substrate at locations around its perimeter while leaving a center region of the backside of the substrate exposed; and during processing, also contacting the backside of the exposed center region of the substrate with a support post.

* * * * *